United States Patent [19]

Borenstein et al.

[11] Patent Number: 5,178,685
[45] Date of Patent: Jan. 12, 1993

[54] METHOD FOR FORMING SOLAR CELL CONTACTS AND INTERCONNECTING SOLAR CELLS

[75] Inventors: Jeffrey T. Borenstein, Maynard; Ronald C. Gonsiorawski, Danvers, both of Mass.

[73] Assignee: Mobil Solar Energy Corporation, Billerica, Mass.

[21] Appl. No.: 713,687

[22] Filed: Jun. 11, 1991

[51] Int. Cl.$^5$ .................. H01L 31/05; H01L 31/0224; H01L 31/18
[52] U.S. Cl. ........................ 136/244; 136/256; 437/2; 437/188; 257/431; 257/734
[58] Field of Search ............... 136/244, 256, 261; 357/30 J, 30 K, 30 Q, 65-67; 437/2-5, 188, 197, 202

[56] References Cited

U.S. PATENT DOCUMENTS

| | | | |
|---|---|---|---|
| 4,235,644 | 11/1980 | Needes | 136/256 |
| 4,256,513 | 3/1981 | Yoshida et al. | 136/256 |
| 4,293,451 | 10/1981 | Ross | 252/512 |
| 4,347,262 | 8/1982 | Marcus | 427/74 |
| 4,375,007 | 2/1983 | Marcus | 136/256 |
| 4,388,346 | 6/1983 | Sickler | 426/58 |
| 4,534,099 | 8/1985 | Howe | 437/2 |
| 4,602,120 | 7/1986 | Wakefield et al. | 136/256 |
| 4,640,001 | 2/1987 | Koiwai et al. | 437/2 |
| 4,643,913 | 2/1987 | Okunaka et al. | 427/75 |
| 4,737,197 | 4/1988 | Nagahara et al. | 136/256 |
| 4,751,191 | 6/1988 | Gonsiorawski | 437/2 |
| 5,074,920 | 12/1991 | Gonsiorawski et al. | 136/244 |

FOREIGN PATENT DOCUMENTS

| | | | |
|---|---|---|---|
| 3-38069 | 2/1991 | Japan | 136/244 |
| WO89/07343 | 8/1989 | PCT Int'l Appl. | 136/256 |

OTHER PUBLICATIONS

Spectrolab, Inc., Final Report, Aug. 1980 Under JPL Contract 954853 entitled "Investigation Of Proposed Process Sequence For The Array Automated Assembly Task—Phases I & II"—Title Page and pp. 140 and 163.

Copy of brochure of Transene Company, Inc. for "N- and P-DIFFUSOL For Semiconductor Technology.".
Copy of brochure by "Thick Film Systems" entitled Thick Film Screen Printable Silver Conductor Pastes, Bulletin C-332-1 (1979).
"Thick-Film Metallization For Solar Cell Applications", IEEE Transactions on Electron Devices, Cheek et al, Vol. ED-31, No. 5, May 1984.
"Developments In Polycrystalline Silicon Solar Cells And A Novel Form Of Printed Contact", Haigh, International Conference on Solar Electricity, France (1976).
"Fired Through Printed Contacts on Anti-reflection Coated Silicon Terrestrial Solar Cells", Haigh, presented at 12th IEEE PVSC Meeting (1976).
"High Performance BSF Silicon Solar Cells With Fire Through Contacts Printed on AR Coating", Nunoi et al, presented at 14th IEEE PVSC meeting (1980).
"An Advanced Solar Cell Production Line Based On LSSA Funded Processes", Godfrey et al, presented at 15th IEEE PVSC meeting (1982).
"A New Process For High Efficiency Silicon Solar Cells", Nakatani et al, presented at 17th IEEE PVSC meeting (1984).
"Critical Processing Parameter Optimization for Screen Printed Semcrystalline Silicon Solar Cells", Mertens et al, presented at 17th IEEE PVSC meeting (1984).

*Primary Examiner*—Aaron Weisstuch
*Attorney, Agent, or Firm*—Pandiscio & Pandiscio

[57] ABSTRACT

Photovoltaic cells with silver-rich thick film electrical contacts having superior thermal aging properties are disclosed. The silver-rich contacts are formed by firing a silver ink or paste wherein substantially all of the silver in the ink or paste before firing is in the form of spherical particles. Preferably inter-cell connections to the contacts are accomplished using a tin and silver solder paste comprising between about 96% tin/4% silver and 98% tin/2% silver. Solar cells having contacts incorporating the present invention exhibit the capability of withstanding temperatures in the range of 150° C. with little or no thermal degradation of contact peel strength in the region of the solder bonds.

28 Claims, 7 Drawing Sheets

METHOD FOR FORMING SOLAR CELL CONTACTS AND INTERCONNECTING SOLAR CELLS

This invention relates to an improvement in the method of manufacturing photovoltaic solar cells and more particularly to an improved method of forming and interconnecting contacts whereby to provide cells with greater reliability.

BACKGROUND OF THE INVENTION

Photovoltaic solar cells essentially comprise a semiconductor substrate having a shallow P-N junction formed adjacent the front surface thereof. The cells require electrical contacts (also called "electrodes") on both their front and rear sides in order to be able to recover an electrical current when the cells are exposed to solar radiation. The contact on the front of the solar cell is generally made in the form of a grid, comprising a plurality of narrow, elongate parallel fingers and at least one elongate busbar that intersects the fingers at a right angle. The width, number and spacing of the fingers are set so as to expose an optimum area of the front surface of the cell to incident solar radiation. The busbar serves as the solder bonding terminal for the grid contact whereby the contact is interconnected with other cells.

In order to improve the conversion efficiency of the cells, a thin anti-reflection ("AR") coating consisting of a material such as silicon nitride is provided on the front side of each cell. The AR coating may be applied before or after the grid electrode has been formed.

Commercial acceptance of solar cells is conditioned upon the ability to produce reliable, efficient and long-lasting cells and solar cell modules. As used herein, the term "solar cell module" means a plurality of solar cells that are interconnected electrically and physically so as to form a discrete array that provides a predetermined voltage output, e.g., a module may consist of 216 cells connected together so as to have a total power output of 220 watts. Typically in such a module the cells are arranged in a rectangular array comprising 12 strings each consisting of 18 cells, with the cells in each string being connected in series and the strings being connected in parallel. The cells in each string are interconnected by copper connecting strips (also called "tabs") that are bonded to the front and back electrodes. A selected number of such modules may be connected together to form a solar panel having a desired power output.

The reliability and efficiency of solar cells are affected by the nature and quality of their front and rear contacts. Accordingly, much effort has been directed to developing reliable, low resistance, solderable contacts and improving the techniques of making the contacts so as to reduce breakage and thereby increase production yield of solar cells.

Aluminum, because of its low cost and good electrical conductivity, is the most common material used to fabricate the back contacts of solar cells. Typically, the aluminum back contact is made by coating the rear side of a silicon substrate with an aluminum paste (also called an "ink"). The terms "paste" and "ink" are used interchangeably to describe contact-forming liquid compositions comprising metal particles disposed in an organic liquid vehicle. Therefore, in the context of this invention, both terms are used to describe the viscous aluminum and silver compositions that are used to form solar cell contacts. The aluminum pastes are fired so as to remove the organic vehicle by evaporation and/or pyrolysis and cause the metal particles to alloy with the silicon substrate and thereby form an ohmic aluminum/silicon contact. Unfortunately, aluminum tends to form a surface oxide when exposed to air. That surface oxide increases contact resistance and also inhibits direct soldering.

Various methods have been used for overcoming the aluminum soldering problem. A currently favored technique involves first forming an aluminum contact on the back of the solar cell substrate that is discontinuous in the sense that it defines a plurality of openings ("windows") through which the underlying silicon substrate is exposed, and then applying a suitable silver paste to those areas of the back surface of the substrate that are exposed by the windows. These areas of silver paste are then fired to form a plurality of silver "soldering pads". Preferably the silver soldering pads overlap the surrounding aluminum contact. These soldering pads are used as solder bonding sites for cell interconnecting tabs in the form of tin-coated copper ribbon which are used to interconnect aluminum contact to adjacent solar cells. This technique is described in copending U.S. patent application Ser. No. 561,101, filed Aug. 1, 1990 by Frank Bottari et al for "Method Of Applying Metallized contacts To A Solar Cell". To the extent necessary, the information disclosed in said U.S. application Ser. No. 561,101 is incorporated herein by reference thereto.

The grid contacts are commonly formed of silver or nickel. One prior art method of forming the front grid contact involves applying a conductive silver metal paste onto the front surface of a solar cell substrate in a clearly defined grid electrode pattern, firing that paste so as to form a bonded ohmic contact, and then applying the AR coating to the front surface of the solar cell substrate. Another common procedure is to first form the AR coating, then etch away portions of that coating so as to expose portions of the front surface of the solar cell substrate in a grid electrode pattern, and thereafter deposit a paste or otherwise form the front contact in those regions where the AR coating has been removed.

Still a third approach is the so-called "fired through" method which consists of the following steps: (1) forming an AR coating on the front surface of the solar cell substrate, (2) applying a coating of a paste comprising metal particles and a glass frit onto the AR coating in a predetermined pattern corresponding to the configuration of the desired grid electrode, and (3) firing the paste at a temperature and for a time sufficient to cause the metal/glass frit composition to dissolve the underlying AR coating and form an ohmic contact with the underlying front surface of the solar cell substrate. The "fired through" method of forming contacts is illustrated by PCT patent application Publication No. WO 89/12321, published 14 Dec. 1989, based on U.S. application Ser. No. 205,304, filed 10 Jun. 1988 by Jack Hanoka for "An Improved Method of Fabricating Contacts For Solar Cells". The same concept of firing metal contacts through an AR coating is further described in U.S. Pat. No. 4,737,197, issued to Y. Nagahara et al for "Solar Cell With Metal Paste Contact". The teachings of those documents is incorporated herein by reference thereto.

Attempts to reduce the cost of manufacturing solar cells have involved investigation and use of a number of coating techniques for applying metal-containing conductive inks to the solar cell to form contacts, notably screen printing, pad printing, and direct writing. The pad printing technique is preferred for forming aluminum back contacts with windows filled with silver soldering pads because it permits formation of contacts at a relatively low cost, with high throughput rates and very low substrate breakage rates. The direct write technique is preferred for applying a silver paste to the front side of the solar cell substrate to form the busbars and fingers of the grid electrode. This technique is illustrated and described in copending U.S. application Ser. No. 666,334 of Jack I. Hanoka et al, filed 7 Mar. 1991 for "Method And Apparatus For Forming Contacts". The teachings of that application are incorporated herein by reference thereto.

In the course of manufacture and in many common applications, the photovoltaic cells are subjected to continuous high temperatures or else to thermal cycles at regular or irregular intervals. For example, in the ethylene vinyl acetate (EVA) lamination procedure that typically follows cell stringing (interconnecting) in the manufacture of multi-cell modules, the cells are subjected to temperatures as high as about 150° C. for about 45-60 minutes. Also, when used in the production of solar energy, the cells will heat up during a cycle of exposure to sunlight and then cool down again to ambient temperatures at night. In other applications, the heating and cooling cycles may be much more frequent. Accordingly, an important requirement of such cells is the ability to withstand thermal aging, particularly with respect to their solder connections.

The twin requirements of high reliability and efficiency have placed significant demands upon the contacts metallization system. In this connection, it is to be appreciated that an important component of the performance of solar cell modules is the reliability of the bonds between the cell contacts and the solar cell substrates, which are subject to thermal aging and also peeling forces applied by the cell-coupling tabs that interconnect the cells in a module.

Prior art silicon photovoltaic cell modules incorporating silver electrical front contacts and aluminum rear contacts with silver soldering pads, with copper cell-coupling tabs soldered to those contacts and pads, tend to show poor mechanical reliability of their solder bonds when subjected to thermal aging. It has been found that the bond reliability factor is especially critical for the grid contact. Specifically, it is known that the strength of solder bonds made to silver/glass thick films on silicon using 63% tin/37% lead or 62% tin/36% lead/2% silver solders degrades by more than 80% upon exposure to temperatures of 150° C. for one hour. As noted above, exposure to such temperatures for up to one hour is typically required to laminate the cells to glass in the manufacture of photovoltaic modules. Consequently, the substrate/solder/tab bonds in modules made with such solders are inherently weak. Stress testing of modules made in this manner indicate that their performance degrades relatively rapidly under conditions that produce mechanical loading on the module, including changes in temperature which can be expected to occur in typical applications.

The literature in this field also suggests that the problem of thermal instability of contacts with solder bonds as described above, may be caused, at least in part, by the formation of intermetallic compounds between tin and silver because such compounds are known to be brittle and weak. While heating promotes formation of such components, it is believed that they tend to form slowly even at room temperature. There has been some belief that these brittle compounds promote the metallization failure at low stress levels.

Recently, it was discovered that improved contact reliability can be achieved by bonding the copper tabs to the silver grid contacts and soldering pads by using a solder paste with a combination of tin and silver ranging from about 96% tin/4% silver to about 98% tin/2% silver, with the paste preferably incorporating one or more compatible, volatile fluxing agents. This invention is disclosed and claimed in U.S. Pat. No. 5,074,920, issued to Ronald C. Gonsiorawski et al for "Photovoltaic Cells With Improved Thermal Stability", which is incorporated herein by reference thereto. An example of a solder selected according to the teachings of Gonsiorawski et al is "Xersin 2005", which is a solder paste comprising approximately 96% tin and 4% silver in a synthetic flux, manufactured by Multicore Corp., a company having United States offices in Westbury, N.Y. To the extent necessary, the teachings of Gonsiorawski et al U.S. Pat. No. 5,074,920 are incorporated herein by reference thereto.

In the development of this invention, efforts were directed to determining whether or not selected silver pastes could improve grid electrode bond reliability. It was observed that the grid electrode bond reliability problem was most acute in the regions where the tabs are soldered to the bus bars of the grid contacts. A severe reduction in peel strength in those regions was observed when the cell contacts were thermally soaked (i.e., heated to a predetermined temperature for a measured time) and then tested for peel strength. The thermal aging effect leading to reduced peel strength was investigated as to the role of the solder chemistry and also the physical and chemical properties of different silver pastes. The investigation has lead to the belief that the failure mechanism is related to surface diffusion of tin from the solder under the driving force of heat. In-diffusion of tin deep into the bulk of the silver busbar is believed to cause the busbar structure to swell, putting tensile stress on the glass component of the busbar. Tensile stress reduces the fracture strength of the busbar, resulting in lower contact bond peel strength.

One result of the investigation was the discovery, disclosed by the Gonsiorawski et al U.S. Pat. No. 5,074,920, supra, that the thermal aging effect could be reduced by changing solder composition, since the role of solder chemistry in the fracture mechanism is related to the eutectic temperature of the solder. Tin surface diffusion at temperatures close to the solder eutectic temperature is significant, causing the swelling and weakened bonds. As disclosed in said U.S. Pat. No. 5,074,920 of Ronald C. Gonsiorawski et al, improved temperature stability can be achieved if the standard 62% tin/30% lead/2% silver (which has a eutectic temperature of about 179 degrees C.) is replaced by a solder having a composition in the range of 96% tin-4% silver to 98% tin-2% silver. The 96% tin-4% silver solder has a eutectic temperature approximately 40 degrees C. higher than the standard 62% tin-36% lead-2% silver solder, and this higher eutectic temperature improves resistance to thermal aging of the contact bonds.

A second result of the investigation is the present invention. It was postulated that improved metallization reliability for the grid electrode could be achieved by using a silver paste which, after being fired, would be more resistant to in-diffusion of tin. The present invention arises from and comprises the discovery that the form and size of the particles in the silver paste or ink has an effect on bond stability under thermal aging. The present invention comprises the concept that if substantially all of the metal particles in the silver paste have a generally spherical or round form, the reliability of the bond between the contacts and the underlying substrate is greatly improved in the region of the solder connections between the contacts and the tabs that interconnect adjacent cells in a module.

OBJECTS AND SUMMARY OF THE INVENTION

The primary object of this invention is to provide improved contacts for solar cells.

Another object is to provide solar cells having low resistance contacts with solder bonds that exhibit improved resistance to thermal aging.

Still another object is to provide an improved method of making silver contacts and/or silver soldering tabs for solar cells which provide improved contact stability without any loss in cell efficiency.

A more specific object is to provide a method of making grid contacts wherein the busbar(s) and the fingers are formed separately, preferably with the busbar(s) being printed before the fingers.

Another specific object of this invention is to provide an improved method of making grid contacts using the "fired through" technique.

These objects and other objects hereinafter rendered obvious are achieved by the present invention, which consists of the discovery that it is advantageous to make at least selected portions of the grid contacts by use of a silver ink or paste wherein virtually all of the silver particles have a spherical shape. In the case of grid electrodes, this ink is used to print the busbar(s), while the same or a different ink may be used to print the fingers. Preferably the busbar(s) and fingers are printed in two different steps. The spherical particles provide a less porous structure after firing, leading to improved resistance to deterioration from thermal aging.

Other features and advantages of the invention are specifically described or rendered obvious in the following detailed description which is to be considered in conjunction with the drawings hereinafter identified.

THE DRAWINGS

In the various figures, like numerals designate like parts.

Figure 1:
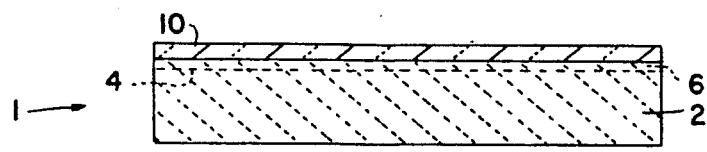
FIG. 1 is a side view in elevation of a silicon substrate having a P-N junction adjacent a first surface thereof and a dielectric anti-reflection coating covering said first surface.
Figure 2:
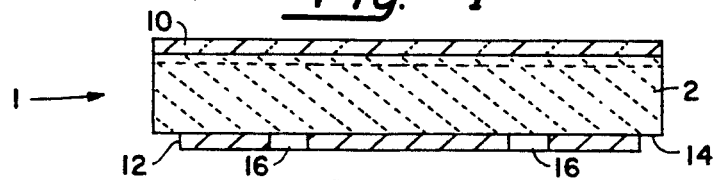
FIG. 2 is a view like FIG. 1, with one layer shown in section, showing application of a windowed aluminum ink or paste to the silicon substrate, with the ink or paste shown in section.

For convenience of illustration and also in order to facilitate understanding of the invention, at least some of the components and features illustrated in the drawings, e.g., the relative thicknesses of the substrate and the various layers on the substrate, the depth of the P-N junction and the N+ and P+ regions, the spacing and size of the silver soldering pads and the elements of the grid electrode, and the spacing between and the relative sizes of the openings formed in the AR dielectric layer on the substrate, are not drawn to scale.

SPECIFIC DESCRIPTION OF THE INVENTION

Referring now to the drawings, the preferred embodiment of the invention is described in relation to FIGS. 1-8 which illustrates the production of solar cells using EFG-grown silicon in ribbon or sheet form. For this embodiment, there is provided as a starting piece a partially finished cell 1 or solar cell substrate (FIG. 1) that comprises a substrate 2, preferably in the form of a length of P-type conductivity silicon ribbon produced by the EFG method, that has been processed so that one side (hereafter the "front side") has been provided with a relatively shallow junction 4 (e.g., a junction having a depth of between about 3000 and about 7000 angstrom units), an N-type (typically N+) conductivity region 6, and a dielectric layer 10 overlying the front surface of the silicon substrate that functions as an anti-reflection ("AR") coating. Although various dielectric materials may be used as an AR coating, e.g., silicon nitride, titanium dioxide, and silicon dioxide, it is preferred that the dielectric layer comprise a species of silicon nitride.

To the extent already described, the partially finished cell may be fabricated by various methods and means well known in the art. For instance, junction 4 and N+ conductivity region 6 may be formed in a P-type silicon substrate 2 by the diffusion of phosphorous from a gaseous or solid source. The silicon nitride layer 10 also may be formed in various ways, e.g., by a plasma vapor deposition process as disclosed in U.S. Pat. No. 4,751,191, issued Jun. 14, 1988 to Ronald C. Gonsiorawski et al for "Method Of Fabricating Solar Cells With Silicon Nitride Coating" or by diffusion from a solid source applied as a coating onto the substrate.

Figure 3:
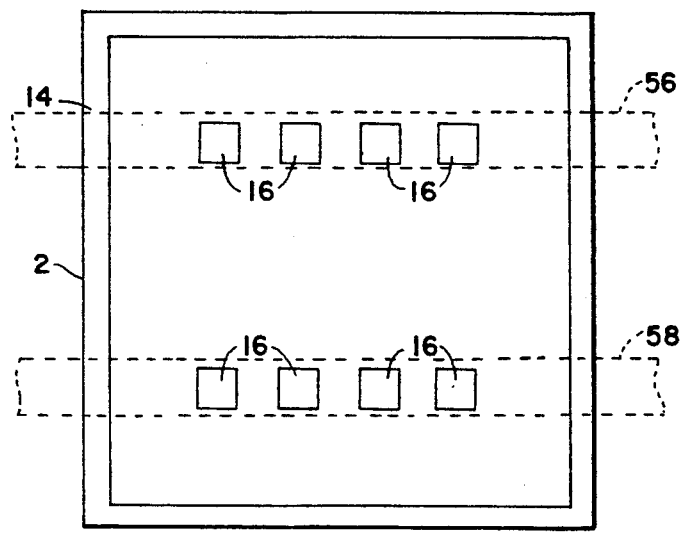
FIG. 3 is a bottom plan view of the silicon substrate showing the configuration of the aluminum ink paste.
Figure 4:
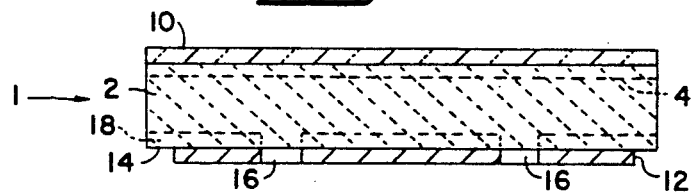
FIG. 4 is a view like FIG. 2 illustrating the device shown in FIG. 3 after it has been heat treated to alloy the aluminum of the aluminum ink or paste to the substrate.

Referring now to FIGS. 2-5, the first step in converting the partially finished cell 1 to a finished solar cell comprises covering the rear side of the substrate with a coating 12 of a paste containing aluminum particles in an organic vehicle so that all of the rear side of the substrate is coated except for a rectangular marginal portion 14 and a plurality of rectangular apertures or windows 16. Apertures 16 are arranged in parallel rows as shown in FIG. 3. Then the aluminum ink is fired by heating the substrate in nitrogen at a temperature of from about 670 to 850 degrees C., preferably about 760 degrees C. This firing eliminates the organic vehicle component of the aluminum ink and causes the aluminum particles to alloy with the silicon substrate. The firing of the aluminum ink also produces a P+ region 18 (FIG. 4).

Figure 5:
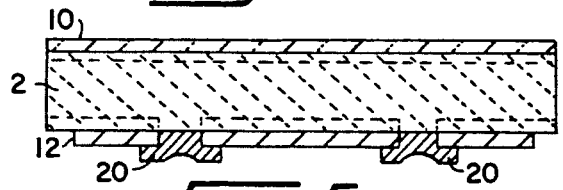
FIG. 5 is a view like FIG. 2 showing how the silver soldering pads are deposited in the window of the aluminum layer, with the aluminum and silver pads shown in section.
Figure 6:
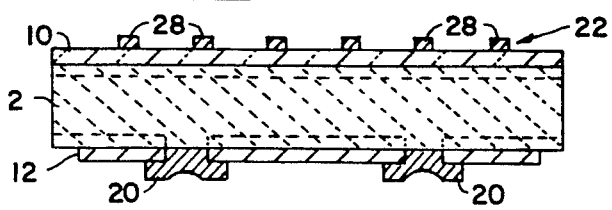
FIG. 6 is a view like FIG. 5 showing how a metal ink is applied to the front side of the same structure in the pattern of a grid electrode.
Figure 7:
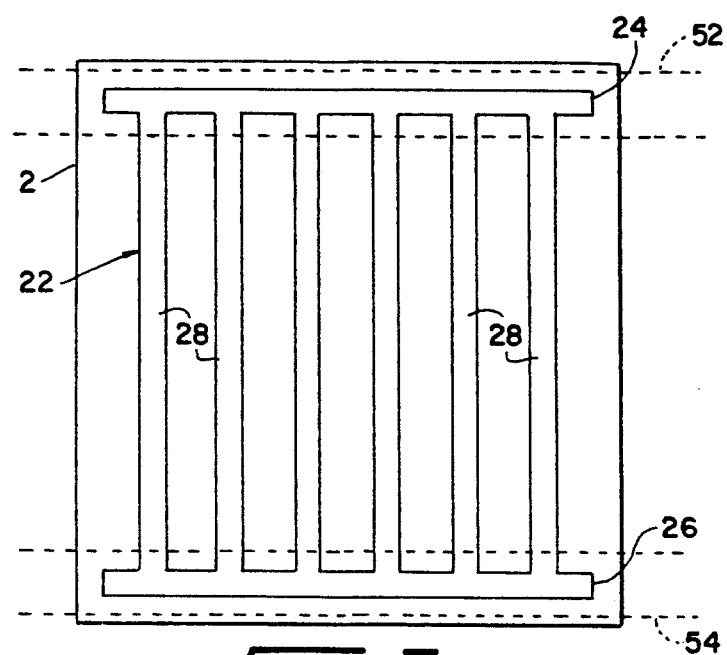
FIG. 7 is a plan view illustrating the configuration of the grid electrode.

The next step involves printing a silver paste onto the window areas so that the paste overlaps the aluminum layer 12 by between about 0.015" and about 0.030" at each side of each window. The silver paste applied to the window areas preferably comprises a glass frit and, optionally but not necessarily, it may contain a small amount of nickel in the form of particles. FIG. 5 generally illustrates the cross-sectional shape of the resulting soldering pads 20 after they have been fired as hereinafter described, with the pads being bonded to the substrate and also overlapping and making electrical contact with aluminum layer 12. The wet silver paste is dried for between 1 and 20 minutes in an oven in an air or nitrogen atmosphere heated to a temperature of about 100-150 degrees C.

Then a silver paste (FIGS. 5 and 7) is applied onto the front side of the substrate so as to form a coating 22 in overlying relationship with the silicon nitride layer, with the silver paste coating being arranged so as to define a predetermined electrode pattern comprising a pair of parallel spaced busbars 24 and 26 and a plurality of narrow elongated fingers 28 extending between the two busbars. The fingers 28 are much narrower than the busbars. Preferably the silver paste defining the busbars 24, 26 is applied in a separate step preceding the application of the silver paste that is used to form the fingers 28, with different silver inks being used for the two steps.

Application of the paste(s) forming the grid pattern may be accomplished using any of the known printing techniques which are commonly used in the electronics industry, including screen printing, pad printing and direct writing. Preferably, however, the grid-defining layer 22 is applied by the direct writing technique in two separate steps. The paste(s) forming layer 22 is preferably dried for between 1 and 20 minutes in an air or nitrogen atmosphere at a temperature between about 100 and 150 degrees C.

Thereafter the entire assembly is fired so that simultaneously (1) the silver paste(s) forming the coating that defines the grid electrode pattern 22 will pass through the silicon nitride and the sintered silver particles will form an ohmic contact with the underlying upper surface of the substrate, and (2) the silver particles in the paste forming the soldering pads 20 are sintered and bonded to the silicon substrate. Firing of the silver paste coating that defines the front grid contact pattern and the silver paste that makes up the pattern of the soldering pads 20 is conducted in an infra-red furnace with an air or oxygen-containing atmosphere at a temperature between about 750 and about 850 degrees C. The firing temperature and time may vary, but in any case the firing temperature and time must be adequate to volatilize or pyrolyze or otherwise remove the organic constituents of the silver pastes and melt the glass frit in silver paste coating 22 until that coating passes through the silicon nitride layer and forms an ohmic bond to the underlying substrate.

Figure 8:
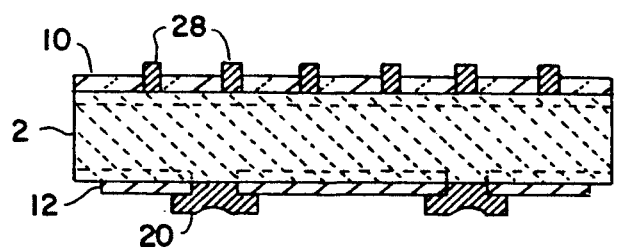
FIG. 8 is a view like FIG. 6 showing the grid electrode in section after it has been fired.

FIG. 8 shows how the finger portions 28 of the coating 22 extend through the silicon nitride layer 10 after being fired as above described.

After the firing step, solder is deposited on the bus bars 24, 26 at a plurality of mutually-spaced points and also on each of the silver soldering pads 20. Then, as illustrated in dotted lines in FIGS. 7 and 3, copper tabs 52, 54, 56, and 58 are secured to busbars 24, 26 and soldering tabs 20, respectively by heating and reflowing the deposited solder.

Various silver inks have been used in manufacturing solar cells. See, for example, copending U.S. application Ser. No. 561,101, of Frank Bottari et al, supra, copending U.S. application Ser. No. 586,894, filed 24 Sep. 1990 by David A. St. Angelo et al for "Electrical Contacts And Method Of Manufacturing Same", now U.S. Pat. No. 5,118,362; and copending U.S. application Ser. No. 666,334, filed 7 Mar. 1991 by Jack I. Hanoka et al for "Method And Apparatus For Forming Contacts" for various ink compositions.

A commonly used silver ink is the one manufactured by the Ferro Electronics Division of Ferro Corp., located in Santa Barbara, Calif., under the designation "Conductrox 3349". It comprises by weight 45-80% silver particles, 1-5% lead borosilicate glass frit and an organic vehicle comprising 10-30% diethyleneglycol monobutyl ether and 1-5% ethylene glycol monomethyl ether. The silver particles are mostly in the form of large, oddly shaped flakes. This particular ink offers the benefit that it does not detract from cell efficiency. However, it also appears to suffer from the effect of tin in-diffusion resulting from thermal aging, with the result that contact reliability (as measured by peel strength tests following a thermal soaking step) is degraded by thermal aging.

Figure 11:
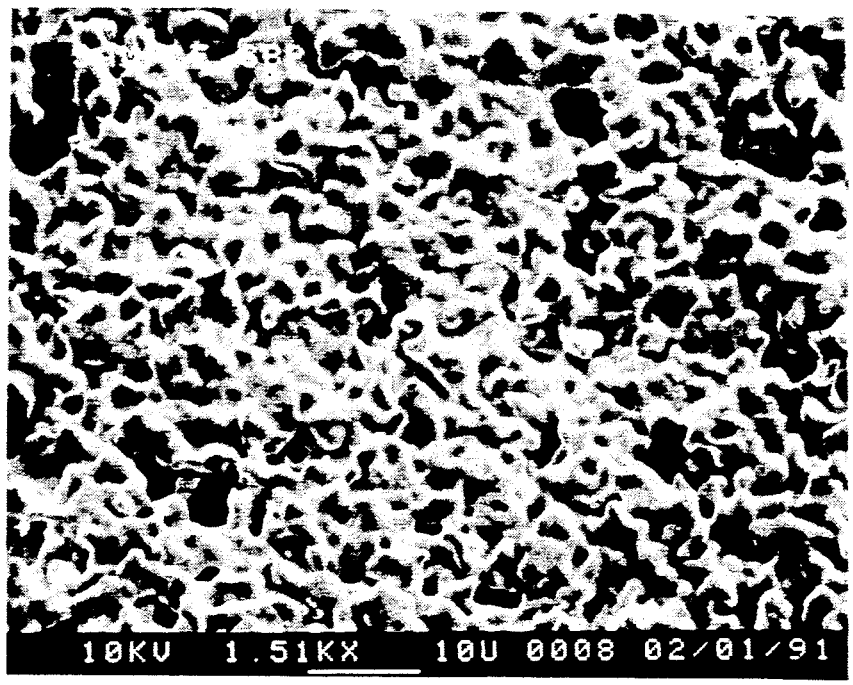
FIG. 11 is a photomicrograph of the top surface of a fired busbar made with the silver paste of FIG. 9.

Prior work has shown that the firing of silver front contacts on solar cells using a conventional paste such as Ferro Conductrox 3349 is preferably accomplished by a so-called "rapid spike firing", in which a substrate coated with the silver/glass frit paste is subjected to a firing temperature of between about 750 and 850 degrees C. (which is below the melting point of silver) for a time which is long enough for the molten glass to penetrate the silicon nitride AR coating but short enough to avoid silver penetration of the P-N junction. Such a firing procedure assures a low resistance ohmic contact with the substrate. However, it appears that the rapid spike firing does not give the silver particles of the Ferro 3349 ink enough time to sinter fully, since the firing temperature is kept below the melting point of silver to assure a low resistance contact and also to avoid penetration of the P-N junction; consequently solidification of the silver particles into a conductive matrix occurs via liquid-assisted solid-phase sintering an is relatively slow. As noted above, the silver particles in the Ferro Conductrox 3349 paste are predominantly relatively large, oddly shaped flakes. It has been found that they sinter slowly because the large, oddly shaped flakes do not fit well together. The incomplete sintering is reflected in the fact that the fired Ferro Conductrox 3349 ink has a porous, voided structure as shown in FIG. 11. This porous structure is believed to facilitate diffusion of tin from the solder into the contact, resulting in a reduced reliability due to thermal aging.

In contrast, silver spheres in a silver/glass frit paste sinter more rapidly at a temperature in the order of 790 degrees C., with the rate increasing as the particle size decreases. The generally spherical or globular particles will fit together better than oddly shaped flakes and, therefore, the ink with spherical particles will produce a less porous contact that offers more resistance to in-diffusion of tin and hence has greater reliability. At the same time, the electrical efficiency of the resultant cells is at least equal to that of cells made with silver inks having silver particles that are predominantly non-spherical in shape. A suitable ink containing predominantly spherical particles is available from Ferro Corp. under the designation Ferro FX 33-069. It is believed that the spherical particles in the 33-069 ink have a maximum particle size of about 5.0 microns.

Figure 9:
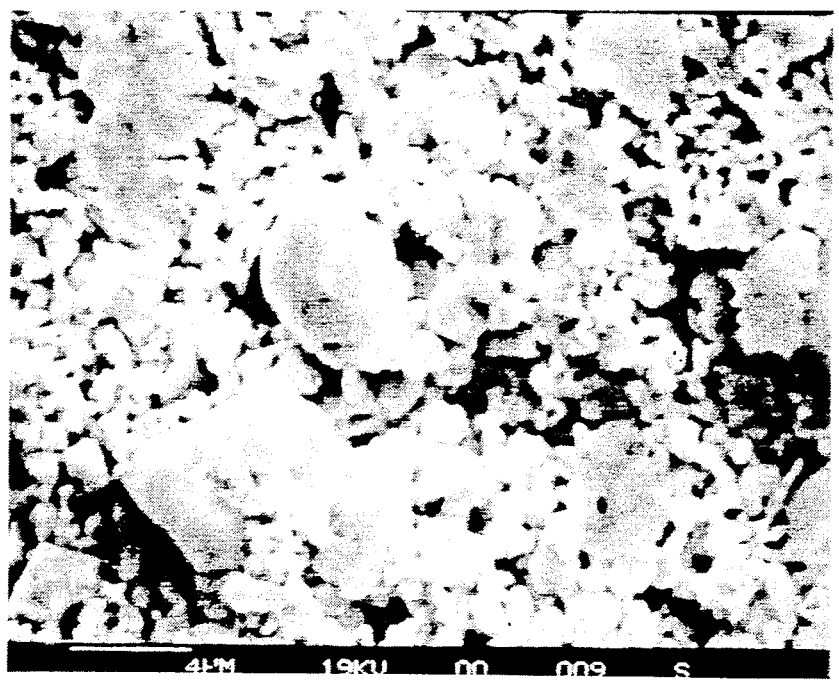
FIG. 9 is a photomicrograph of a dried but unfired silver paste comprising silver particles in various shapes.
Figure 10:
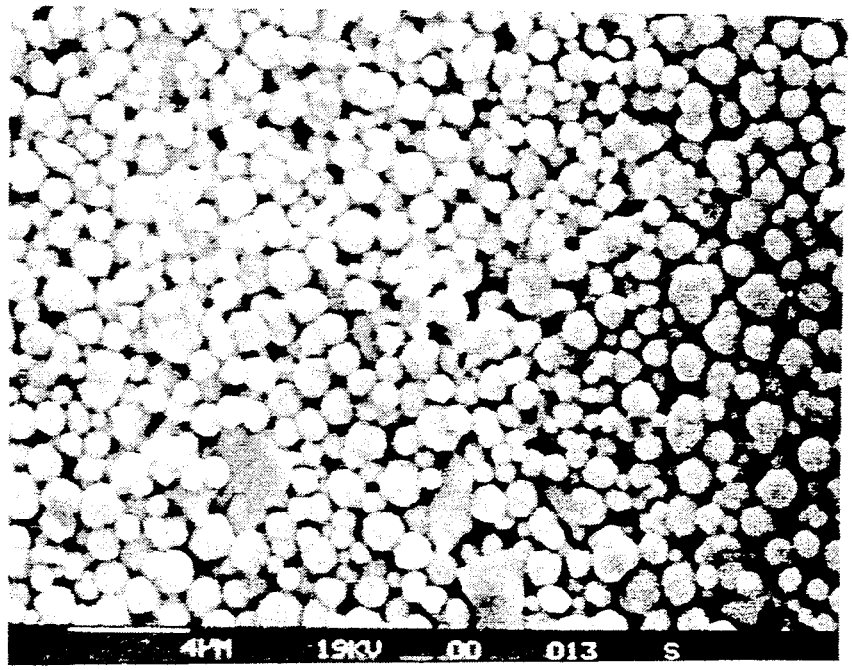
FIG. 10 is a photomicrograph like FIG. 9 of a dried but unfired silver paste where virtually all of the silver particles in the paste have a generally round form.

FIGS. 9 and 10 are photomicrographs comparing the nature of the particles in the Ferro Conductrox 3349 ink and the Ferro FX 33-069 ink in dried but unfired form. As seen in FIG. 9, the Ferro Conductrox 3349 ink comprises relatively large particles having odd or different shapes and sizes. In contrast, FIG. 10 shows that most or substantially all of the silver particles in the unfired Ferro FX 33-069 ink are round, i.e., they have a generally spherical shape.

Figure 12:
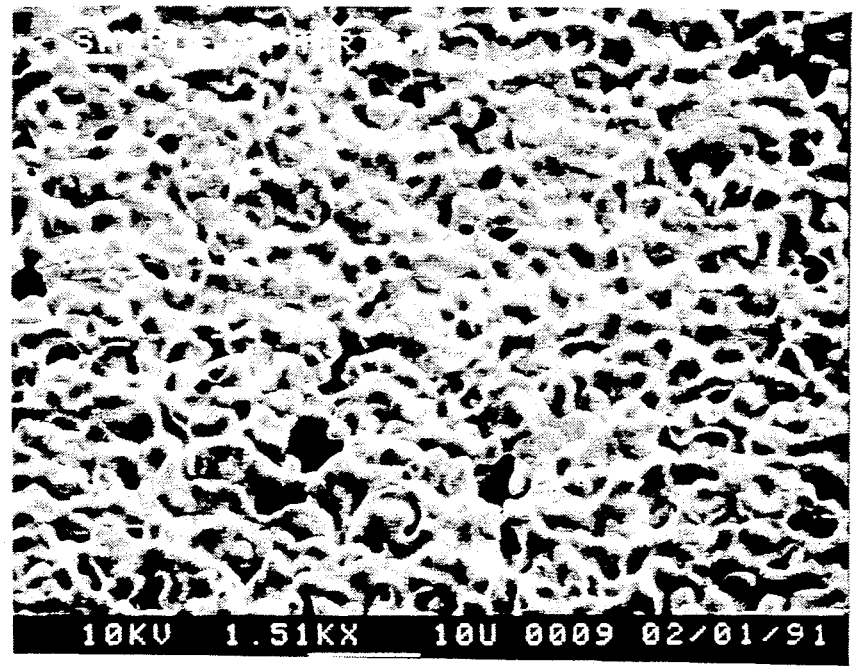
FIG. 12 is a photomicrograph of the top surface of a fired busbar made with the silver paste of FIG. 10.
Figure 13:
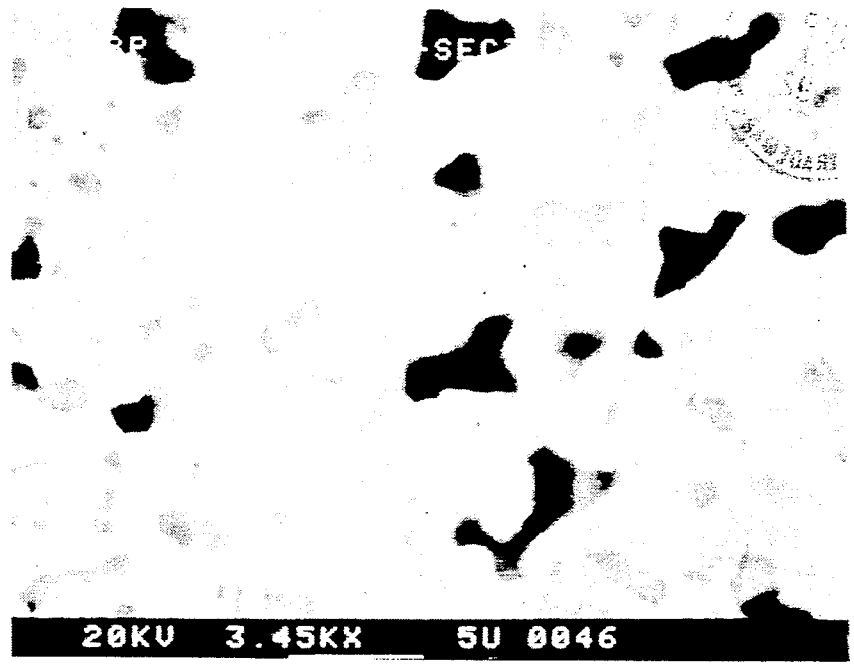
FIGS. 13 and 14 are photomicrographs of cross-sections of the samples of FIGS. 11 and 12 respectively, with the sections constituting a 4 degree section cut with a diamond wheel.
Figure 14:
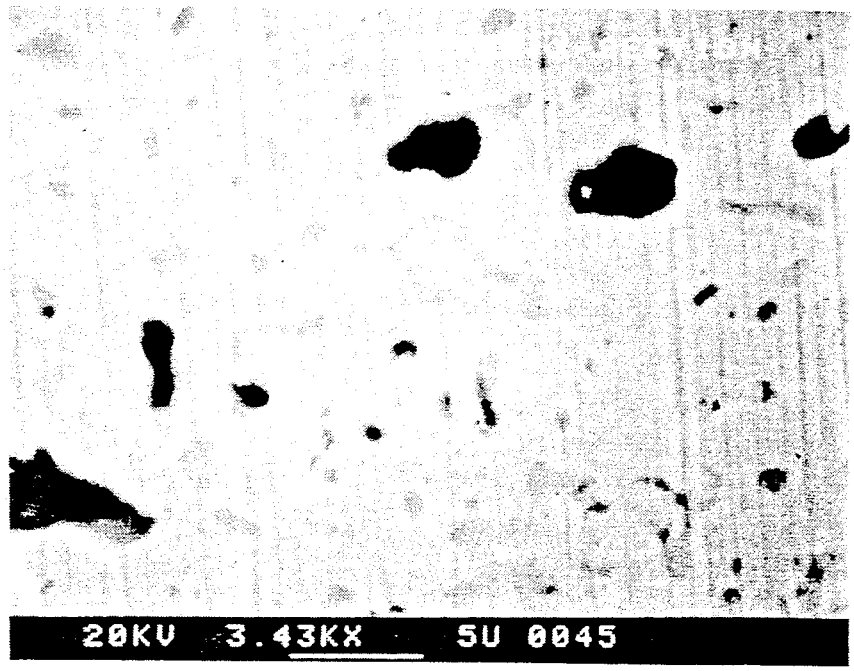

FIGS. 11 and 12 are photomicrographs comparing fired busbars made with the Ferro Conductrox 3349 ink and the Ferro FX 33-069 ink, respectively. In both cases, the inks were fired under essentially identical conditions to a peak temperature of about 790 degrees C. for about 5-10 seconds. FIG. 11 illustrates that the fired Ferro 3349 ink provides an obviously voided structure with large crevices and openings. The same kind of voided structure is less evident in FIG. 12. The voids are randomly spaced in both photomicrographs. With reference to FIGS. 13 and 14, the dark areas represent voids in the bulk of the busbar, and it is obvious that the population of voids is greater using the Ferro Conductrox 3349 ink (FIG. 13) in comparison with the Ferro FX 33-069 ink (FIG. 14).

Since smaller particles are more rapidly sintered and more easily concentrated or packed, it is preferred that the spherical silver particles be relatively small, with the size ranging from about 0.5 to about 10.0 microns, preferably in the range of 1.0 to 2.0 microns. Having silver particles below 0.5 microns in diameter is to be avoided since it has been found that the silver sintering occurs too rapidly to permit complete penetration of the silicon nitride layer by the molten glass of the silver ink or paste.

It has been determined that a paste with generally spherical (globular) silver particles should be dried before firing in order to improve results. Since sintering of the silver spheres occurs rapidly, if the solvents constituting the vehicle are not substantially fully removed before firing, solvents trapped in the bulk of the printed busbar may burst through the solidified surface of the busbar during firing. Such escape of trapped solvent tends to adversely affect the continuity of the busbar and/or the electrical properties of the cell.

The present invention is preferably practiced by printing the grid electrode pattern on the silicon nitride in two discrete phases. In the first phase, a silver-rich ink wherein substantially all of the silver is in the form of spherical or non-spherical particles is printed onto the silicon nitride so as to define at least one and preferably two busbars patterns. In the second phase, the same or a different ink is printed onto the silicon nitride so as to define a pattern of fingers that intersect the bus bar pattern. Both ink patterns are then fired simultaneously so as to cause the molten glass frit component to dissolve the underlying silicon nitride and cause liquid-assisted solid-phase sintering of the silver particles and bonding to the silicon substrate.

For a better understanding of the present invention, the following example is presented. For convenience of understanding and not by way of restriction, the following example is described with reference to FIGS. 1-8. This example should in no way be construed as limiting the field or scope of this invention.

EXAMPLE 1

Photovoltaic solar cell substrates 2 were provided in the form of polycrystalline EFG-grown silicon sheets or plates measuring approximately 3.78 inches long by approximately 3.78 inches wide, and having a thickness of approximately 15 mils. The sheets had a shallow P-N junction formed therein at a depth of about 0.5 microns below their front surfaces. The substrates also comprised a silicon nitride AR coating 10 on their front surfaces having a thickness of about 800 Angstroms and a fired aluminum rear contact 12 on their rear surfaces. The aluminum contact was formed by use of an aluminum/glass frit screen printing ink manufactured by Electro Science Labs under the product code "ESL No. 2592". The fired aluminum contacts had a thickness of about 8 microns characterized by a plurality of windows 16 measuring approximately 80×120 mils arranged symmetrically in parallel rows.

These substrates were first treated by filling the windows 16 with a coating of DuPont 4942D silver/glass frit paste with spherical silver particles to a thickness of about 45 microns. That paste comprised an organic vehicle in which the silver particles and glass frit were dispersed. The windows were filled so that the paste overlapped the surrounding aluminum contact by about 20 mils. Thereafter, the DuPont 4942D paste in windows 16 was dried at a temperature of about 150-200 degrees C. for about 3 minutes.

Next, formation of the front grid contact was conducted in two distinct phases or steps. One at a time solar cell substrates as above described were mounted in a direct writing machine, e.g., a "Micropen" direct writing machine manufactured by Micropen, Inc. of Pittsford, N.Y., USA, and the latter was operated at room temperature (approximately 25 degrees C.) using the Ferro FX 33-069 silver/glass frit ink so as to write two bus bars as shown at 24 and 26 on the silicon nitride coating covering the front surface of the substrates. The busbar were formed with a width of about 0.045 inch and a thickness of about 20 microns in their as-written state.

Then, without any intervening drying step, each solar cell substrate was mounted in a second direct writing machine and the latter was operated at room temperature using the Ferro Conductrox 3349 ink so as to write fingers as shown at 28 that intersect the written busbars. The resulting finger elements had a width of about 0.008 to 0.010 inch and a thickness of about 20 microns in their as-written state.

Then the solar cell blanks were dried in air at about 150-200 degrees C. for about 3 minutes. Thereafter the blanks were fired for three minutes in an infra-red furnace, in an air ambient atmosphere. The temperature of the blanks was ramped up from 200° C. to a peak temperature of about 790 degrees C. and ramped back down to 200° C. The blanks are held at the peak temperature of about 790° C. for about 5 seconds. The firing caused the silver ink defining the bus bars 24, 26 and the finger elements 28 to dissolve the underlying silicon nitride layer so that the silver component of the fired ink formed an ohmic contact with the silicon substrate. Simultaneously, the DuPont 4942D ink in windows 16 was converted to silver pads 20. The silver particles of the Ferro FX 33-069, Ferro Conductrox 3349, and DuPont 4942D inks were sintered during the firing. The fired busbars had a width of about 0.045 inch and a height of about 15 microns, while the fired fingers had a width of about 0.008 inch and a height of 15 microns. The fired silver soldering pads 20 had a thickness of about 40 microns. Subsequently, copper strips 52 and 54 were soldered to the busbars. This was done by first depositing 96 tin/4 silver Xersin 2005 solder paste manufactured by Multicore Corporation at four separate sites on each bus bar at ambient temperature, i.e., 25 degrees C. The solder paste was then heated in situ by the use of jets of hot air long enough so as to cause it to reflow and resolidify. During the heating process, the "Xersin 2005" fluxing agent, which is believed to be primarily pentaerythritoltetrabenzoate ("Pentoate"), was driven off and the metallic components of the solder were fused to the silver busbars and the copper conductors 52 and 54. Thereafter the cells were subjected to measurement of their electrical properties and compared with other cells made according to the same procedures and conditions except that their busbars were made using the Ferro Conductrox 3349 silver/glass frit ink. Additional comparative tests were conducted with respect to thermal degration resulting from thermal soaking, as reflected by the results of subsequent peel strength tests.

Table 1 is a comparison of the electrical properties of two batches of cells made according to the procedure described above, one batch of 5 cells having grid contacts with busbars made using the Ferro 33-069 ink and a second batch of 20 cells having busbars made using the Ferro 3349 silver ink. In each case the fired busbars had a width of approximately 44 mils and a thickness of about 15 micrometers. The cells made with busbars made from the Ferro 33-069 paste had efficiencies equivalent to those made with grid electrodes using solely the Ferro 3349 paste.

TABLE 1

| Busbar Ink | No. of Cells | $J_{rv}$ (mA/cm$^2$) | $V_{oc}$ (mV) | $J_{sc}$ (mA/cm$^2$) | FF | P (mW/cm$^2$) |
|---|---|---|---|---|---|---|
| 3349 | 51 | .54 | 576 | 28.09 | .724 | 11.72 |
| 33-069 | 56 | .34 | 576 | 28.13 | .741 | 12.01 |

Tables 2 and 3 provide comparisons of the peel strengths of busbars bonded to copper tabs using the 96% tin/4% silver solder mentioned above, with Table 2 relating to cells with busbars made from the Ferro 33-069 paste and Table 3 relating to cells with busbars made using the Ferro 3349 silver ink. The same process conditions were followed in making the AR-coated solar cell substrates, forming and firing the front and back contacts, and soldering the tabs to the busbars. However, the cells used in the Table 2 tests had busbars with a thickness of about 11 microns and a width of about 44 mils before firing, while the cells used in the Table 3 tests had busbars with a thickness of about 16.5 microns with a width of about 44 mils. Each cell had four solder bonds per busbar. Different groups of cells were heated soaked at temperatures of 135, 150 and 165 degrees C. for different times, at the end of which they were subjected to peel strength tests conducted on each bond. A comparison of Tables 2 and 3 clearly demonstrates that the peel strengths are substantially improved when the busbars are made using a silver/glass frit paste having spherical silver particles.

TABLE 2

SUMMARY OF HOT AIR SOLDER REFLOW BOND PERFORMANCE (Ferro 33-069 Silver Paste)

| HRS. AT | NO. OF BONDS | PEEL STRENGTH (Lbs) | | BOND YIELD (%) | |
|---|---|---|---|---|---|
| | | MEAN | STD. DEV. | >.25 Lbs. | >.1 Lbs. |
| 165° C. | | | | | |
| 0 | 16 | .634 | .219 | 94 | 100 |
| 4 | 16 | .625 | .192 | 100 | 100 |
| 8 | 16 | .600 | .174 | 100 | 100 |
| 12 | 24 | .481 | .243 | 88 | 96 |
| 150° C. | | | | | |
| 0 | 16 | .634 | .219 | 94 | 100 |
| 24 | 16 | .689 | .348 | 94 | 100 |
| 48 | 26 | .479 | .200 | 88 | 94 |
| 135° C. | | | | | |
| 0 | 12 | .703 | .201 | 100 | 100 |
| 48 | 12 | .683 | .174 | 100 | 100 |
| 96 | 12 | .694 | .218 | 100 | 100 |
| 144 | 12 | .628 | .253 | 92 | 100 |
| 192 | 24 | .400 | .215 | 83 | 100 |
| 288 | 24 | .300 | .206 | 50 | 96 |

TABLE 3

SUMMARY OF HOT AIR SOLDER REFLOW BOND PERFORMANCE (Ferro 3349 Silver Paste)

| HRS. AT | NO. OF BONDS | PEEL STRENGTH (Lbs) | | BOND YIELD (%) | |
|---|---|---|---|---|---|
| | | MEAN | STD. DEV. | >.25 Lbs. | >.1 Lbs. |
| 165° C. | | | | | |
| 0 | 32 | 1.24 | .219 | 100 | 100 |
| 4 | 32 | 0.510 | .220 | 72 | 88 |
| 8 | 32 | 0.300 | .241 | 50 | 75 |
| 12 | 32 | 0.200 | .176 | 19 | 69 |
| 150° C. | | | | | |
| 0 | 32 | 1.240 | .291 | 100 | 100 |
| 24 | 32 | 0.206 | .208 | 19 | 69 |
| 48 | 32 | .253 | .265 | 25 | 62 |
| 135° C. | | | | | |
| 0 | 24 | 1.314 | .346 | 100 | 100 |
| 48 | 24 | 0.179 | .150 | 25 | 67 |
| 96 | 24 | 0.226 | .273 | 21 | 67 |
| 144 | 24 | 0.166 | .173 | 12 | 54 |
| 192 | 48 | 0.287 | .400 | 42 | 67 |
| 288 | 49 | 0.150 | .165 | 12.5 | 50 |

Figure 15:
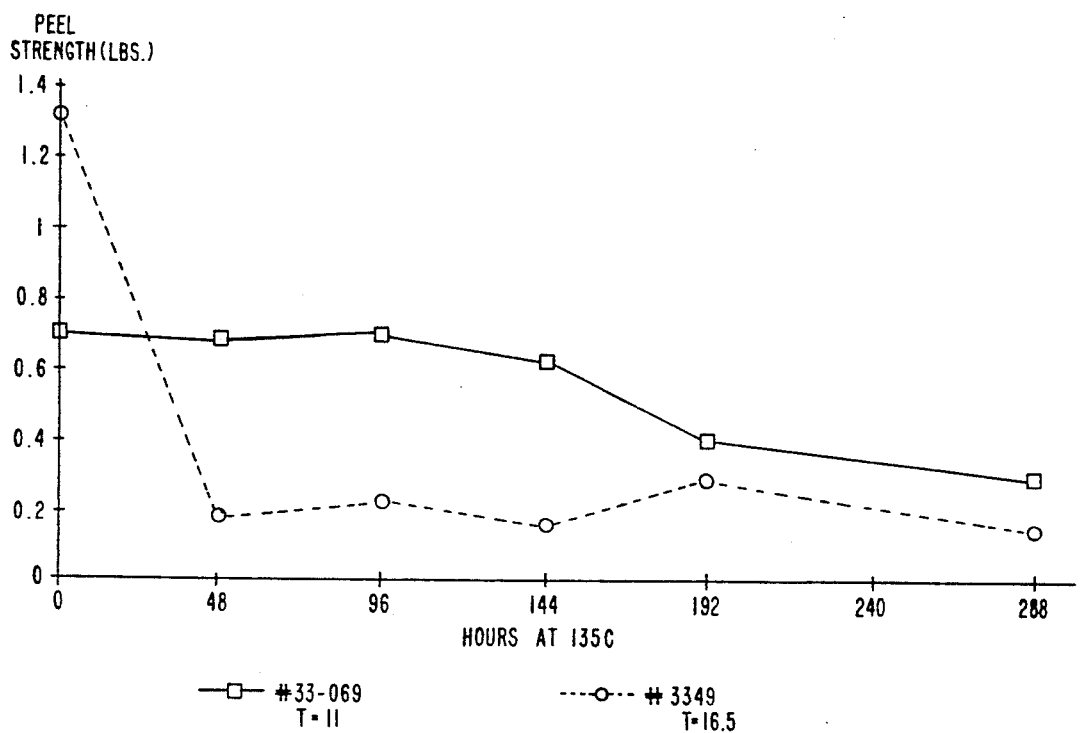
FIGS. 15-18 are graphs illustrating the advantages of the invention.
Figure 16:
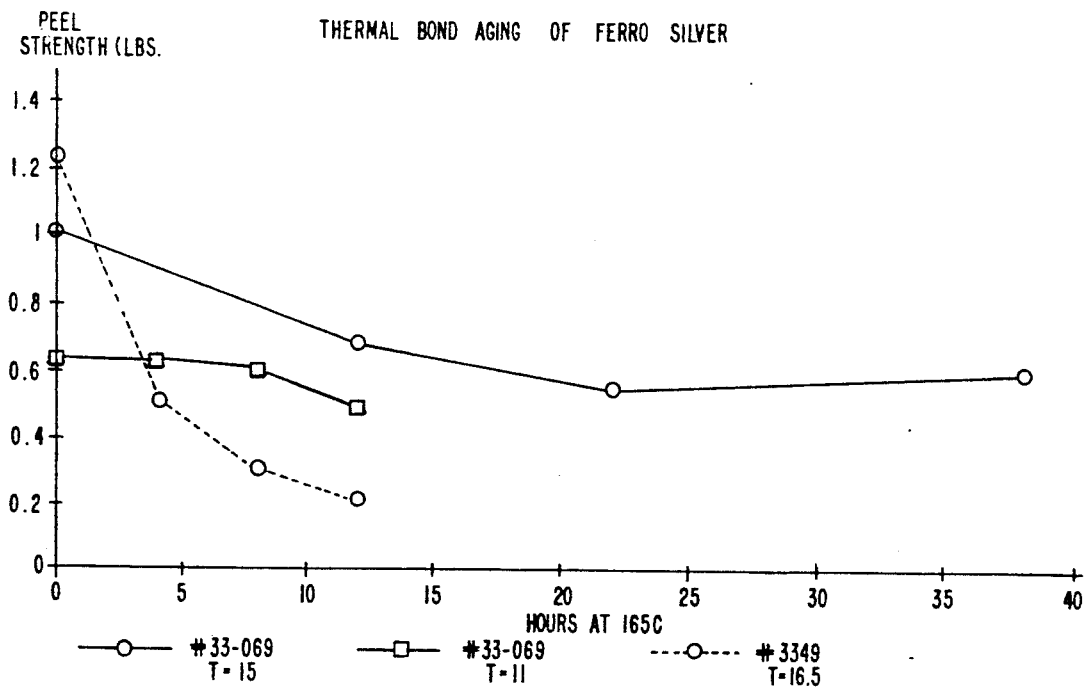
Figure 17:
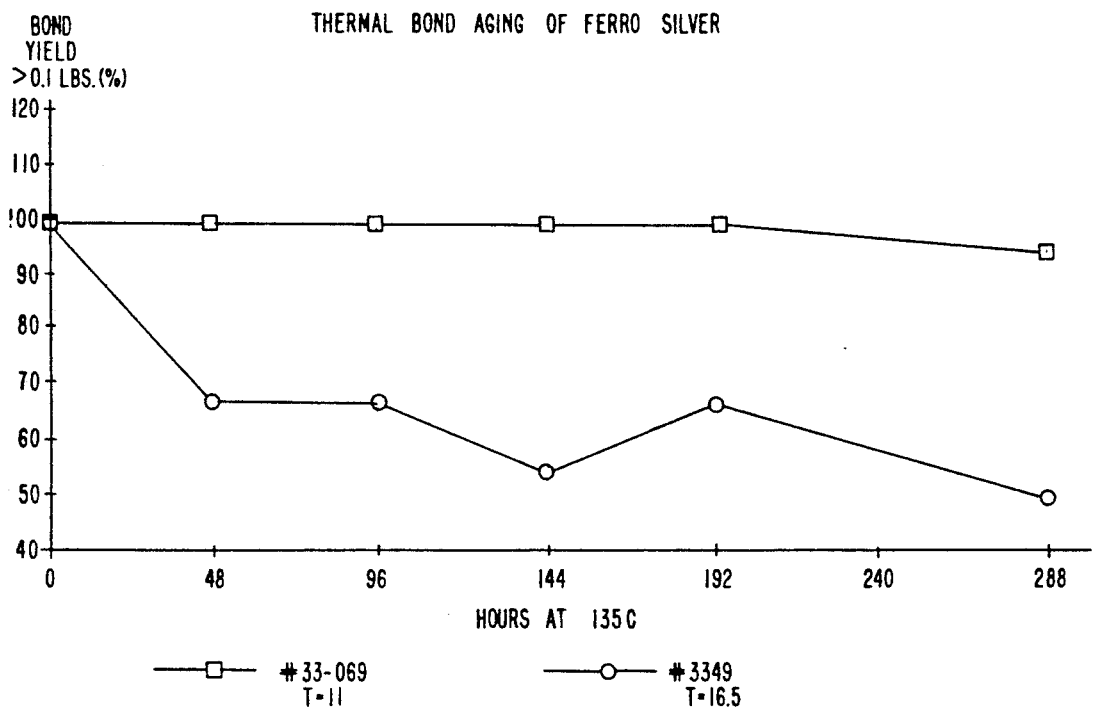
Figure 18:
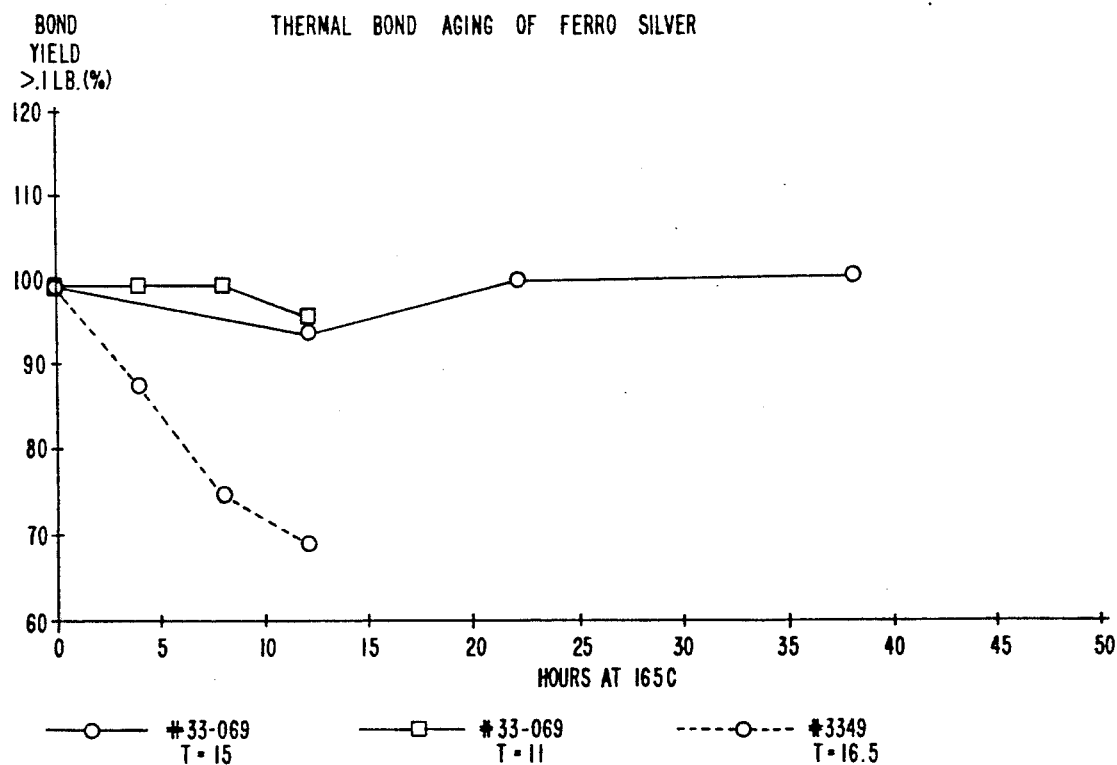

FIGS. 15 to 18 are graphical representations of test results obtained with additional cells having copper connecting tabs soldered to their grid contact with 96% tin/4% silver solder. FIGS. 15 and 16 compare the effect of temperature on the peel strength, with thermal degradation being greater at a thermal soaking temperature of 165 degrees C. than it is at 135 degrees C. In both figures the loss of peel strength under heat was more pronounced for busbars made from the Ferro 3349 paste; in FIGS. 17 and 18 the spherical silver busbars showed greater resistance to bond aging at 135 degrees C. even though their thickness was less (11 microns Versus 16.5 microns for the non-spherical silver busbars); in FIG. 18 illustrating thermal soaking at 165 degrees C., spherical silver busbars with thicknesses of 11 and 15 microns exhibit vastly superior resistance to bond degradation in comparison to 16.5 microns that busbars made with the Ferro 3349 paste.

It is believed that Tables 1-3 and FIGS. 15 to 18 clearly illustrate that the use of a spherical silver/glass grit paste provides a superior metallization system for bus bar bond reliability, and that advantage is obtained without incurring any penalty regarding fill factor or cell efficiency.

In the practice of this invention, the silver ink that is applied to the substrate should contain between about 50 and 80 wt. % silver particles and between about 2 and about 8 wt. % of a glass frit, with the remainder of the ink consisting of an organic vehicle that can be removed by evaporation or combustion. In the case where the aluminum ink contains no glass frit, the concentration of aluminum particles in the ink that is applied to the substrate preferably ranges from between about 70 and 85 wt. %, with the remainder of the ink consisting of the organic vehicle. If the aluminum ink contains a glass frit, it should be formulated so that when applied to the substrate it contains about 50-70 wt % aluminum particles, 2-40 wt % glass frit, and 2-15 wt % organic vehicle.

As noted previously, while substrate temperatures of 750-850 degrees may be used for firing silver pastes on the front and rear sides simultaneously, a peak substrate temperature of about 790 degrees C. is preferred for firing the grid electrode pastes. A belt furnace is preferred for firing the substrates. In such a furnace the conveyor belt runs at a constant speed, but the speed at which the belt is set to run may be varied within limits. Thus the conveyor speed may be set so that the time that each substrate is in the furnace is in the range of about 0.25 to about 2.0 minutes, including the time required to bring the substrate up to the peak firing temperature of 750-850 degrees C. By way of example, if the furnace contains ambient air heated to a temperature of about 850 degrees C., the speed of the conveyor belt is set so that the substrate reaches a peak temperature of about 790 degrees C. and remains at that temperature for about 5 seconds, after which it is cooled down at a selected rate.

As used herein the term "sintering" refers to agglomerization and mutual bonding of particles under the influence of heat. Also the term "liquid assisted solid phase sintering" as used in connection with the silver particle/glass frit pastes describes a sintering process in which the glass frit melts below the melting point of silver, and the liquified glass component promotes sintering of the silver particles.

Obviously, the invention is susceptible of many modifications. Such things as ink rheology, firing conditions, etc., may be changed without departing from the essential character of the invention. Other silver inks also may be used, so long as the ink used for the busbars has substantially all of its silver particles in spherical form. Also, for example, the solar cell blanks need not be EFG-grown substrates, but instead they may be polycrystalline silicon material made by another crystal-growing method, or even single crystal silicon material.

Of course, the fingers of the grid contact and also the silver soldering pads may be made using a paste with spherical silver particles, although the benefit from such a paste is greatest in relation to the busbars and the soldering pads since they are subject to in-diffusion of tin from the solder.

It is to be appreciated that the busbar and finger patterns could be written on the silicon nitride layer using the same ink, or different inks as above described. Preferably the bus bar patterns are directly written with a silver ink wherein substantially all of the silver particles have a spherical or globular shape, with writing of the busbars being accomplished using the "Micropen" direct writing machine, while the fingers are written with the same or a different silver ink using the so-called "High Z" direct writing technique described in copending U.S. patent application Ser. No. 666,334, filed 7 Mar. 1991 by Jack I. Hanoka et al for "Method And Apparatus For Forming Contacts". It has been determined that the "High Z" technique is especially suitable for writing the fingers pattern using an ink with non-spherical silver particles, e.g., the Ferro 3349 ink. Writing the fingers according to the "High Z" technique using a silver ink wherein the silver is in the form of spherical or globular particles is not preferred due to the tendency of the 33-069 paste to clog the writing pen. Furthermore there is uncertainty as to whether or not the fingers can be written with the Ferro 33-069 ink using the "Micropen" machine so as to attain as good an electrical contact as can be obtained if the ink is the Ferro 3349 ink.

It is to be appreciated that although it was developed for the purpose of improving solar cell reliability, the present invention also may be used to improve the reliability of other electronic devices that comprise fired silver contacts, e.g., thick film silvered hybrid circuits. In this connection the improved thermal aging resistance of contacts made according to the present invention is especially significant in the case of electronic devices that are required to be mounted in proximity to other high temperature devices or systems, e.g., electronic devices with fired silver contacts that are installed in the engine compartment of an automobile and form part of its electronic engine-controlling circuit(s).

Still other changes and applications are contemplated without departing from the scope of the invention herein disclosed. Therefore, it is intended that all matter contained in the above description or shown in the accompanying drawings shall be interpreted in an illustrative and not in a limiting sense.

What is claimed is:

1. A method of forming a contact having improved bond reliability on a silicon solar cell substrate having a silicon nitride coating on the front side thereof, comprising the steps of separately forming on said front side of said substrate a plurality of relatively narrow contact elements and at least one relatively wide bus bar element disposed in intersecting relation with said narrow contact elements, characterized in that said relatively narrow contact elements and said at least one bus bar element essentially comprise silver and are formed by firing an ink comprising silver particles and a borosilicate glass frit through said silicon nitride coating, with substantially all of the silver particles in the ink used to form at least said at least one bus bar element having a generally spherical shape.

2. A method according to claim 1 wherein said spherical silver particles have a particle size in the range of 0.5-10 microns.

3. A method according to claim 1 wherein said spherical silver particles have a particle size of 1-2 microns.

4. A method according to claim 1 wherein said glass frit is a lead borosilicate glass.

5. A method according to claim 1 wherein said relatively narrow contact elements are formed using an ink having silver particles in the form of flakes and spheres.

6. A method according to claim 1 wherein said relatively narrow contact elements are formed using an ink characterized in that substantially all of the silver particles have a generally spherical shape.

7. A method according to claim 1 wherein said at least one bus bar element and said contact elements are formed by (a) applying said ink to the silicon nitride layer, and (b) thereafter firing the substrate at a temperature in the range of 750 to 850 degrees C. for a time sufficient to cause the silver and glass frit components of said ink to penetrate the silicon nitride and form an ohmic contact with the substrate.

8. A method according to claim 7 wherein said firing is conducted by heating the substrate to a peak temperature of approximately 790 degrees C.

9. A photovoltaic cell comprising a silicon substrate having front and rear surfaces with a shallow P-N junction adjacent said front surface, and an electrically-conducting thick film silver contact on said front surface, at least a portion of said silver contact being made by firing a paste having silver particles and a glass frit dispersed in a liquid vehicle, with substantially all of said silver particles having a generally spherical shape, a silicon nitride AR coating on said front surface in surrounding relation to said contact, a conductive wire tab, and a tin and silver solder bonding said wire tab to said silver contact.

10. A cell according to claim 9 wherein said solder comprises between about 96% tin/4% silver to about 98% tin/2% silver.

11. A plurality of silicon photovoltaic cells as defined by claim 10 electrically connected by conductive wire tabs bonded to said silver contacts.

12. A photovoltaic silicon cell having improved front contact bond reliability adapted for interconnection with at least one other cell, said photovoltaic silicon cell being prepared by the process of:
 (a) coating apart of a silicon substrate with a silver-rich paste and firing said silver-rich paste to form a silver contact bonded to said substrate;
 (b) applying a tin and silver solder paste to said contact;
 (c) contacting said solder paste with an electrically conducting wire tab; and
 (d) heating said solder paste at a temperature and for a time sufficient to cause the tin and silver components of said solder paste to form a bond between said wire tab and said contact;
 characterized in that substantially all of the silver component of the silver-rich paste is in the form of generally spherical particles.

13. The cell of claim 12 wherein said solder paste comprises about 96% tin/4% silver to about 98% tin/2% silver.

14. A method of making a solar-cell, comprising the steps of:
 (a) providing a silicon substrate having first and second opposite surfaces, a P-N junction adjacent said first surface, and a silicon nitride layer covering said first surface;
 (b) applying to said second surface a first composition comprising aluminum metal particles in a liquid vehicle so as to form a first aluminum-containing coating that covers all but selected areas of said second surface;
 (c) firing said substrate so as to effect removal of said vehicle and alloying of said aluminum metal particles with silicon at said second surface;
 (d) applying to said selected areas of said second surface a second composition comprising particles of silver metal and frit of a borosilicate glass in a liquid vehicle;
 (e) applying to said silicon nitride layer a third composition comprising silver particles and a glass frit in a liquid vehicle so that said third composition forms a third coating that defines at least the bus bar elements of a grid electrode pattern, with substantially all of said silver particles in said third composition having a generally spherical shape; and
 (f) firing said second and third compositions so as to (a) cause the silver metal in said second composition to bond to said substrate and the adjacent alloyed aluminum, and (b) cause the silver and glass frit of the third composition to penetrate said silicon nitride layer so that the silver forms an electrical contact bonded to said first surface and does not penetrate the P-N junction.

15. A solar cell comprising a silicon substrate having first and second oppositely facing surfaces, a P-N junction formed adjacent said first surface, a layer of silicon nitride overlying said first surface, a first grid-shaped silver contact extending through portions of said layer of silicon nitride and bonded to said first surface, and a second contact overlying and bonded to said second surface, said second contact comprising aluminum alloyed with silicon at said second surface, said second contact being formed with a plurality of apertures that expose portions of said second surface, a plurality of silver soldering pads filling said apertures and bonded to said second surface and adjacent portions of said second contact, said grid-shaped silver contact comprising at least one relatively wide busbar element intersected by a plurality of narrow finger elements, with said busbar elements having been formed from firing a silver-rich paste comprising silver particles and a glass frit in an organic liquid vehicle, with substantially all of the silver particles being in globular form and having a diameter between 0.5 and 10.0 microns before firing.

16. A method of making a solar cell having a contact exhibiting improved bond reliability when soldered to a connecting copper conductor, comprising the steps of:
 (a) providing a silicon substrate having first and second opposite surfaces, a P-N junction adjacent said first surface, and a silicon nitride layer covering said first surface;
 (b) covering at least a portion of said silicon nitride layer with a silver-rich paste comprising silver particles and a glass frit in an organic liquid vehicle so that said silver-rich paste defines at least the bus bars of a grid electrode pattern, with substantially all of said silver particles having a generally spherical shape; and
 (c) firing said silver-rich paste at a temperature and for a time sufficient to effect removal of said organic liquid vehicle and cause the silver and glass frit components of said silver-rich paste to penetrate said silicon nitride layer and form a silver contact bonded to said first surface, without any penetration of said P-N junction by the components of said paste.

17. A method according to claim 16 further including the step of soldering a copper conductor to said silver contact using a solder comprising between about 96% tin/4% silver and about 98% tin/2% silver.

18. A method according to claim 17 wherein said silver particles have a particle size of 1–2 microns.

19. A method according to claim 18 wherein said glass frit is a lead borosilicate glass.

20. A method of making a solar cell having a silver contact exhibiting improved bond reliability soldered to a connecting copper conductor, comprising the steps of:
(a) providing a silicon substrate having first and second opposite surfaces, a P-N junction adjacent said first surface, and a silicon nitride layer covering said first surface;
(b) covering at least a portion of said silicon nitride layer with at least one silver-rich paste comprising silver particles and a glass frit in an organic liquid vehicle so that said at least one silver-rich paste defines a grid pattern, with at least one portion of said grid pattern being formed by a silver-rich paste having substantially only silver particles having a generally spherical shape;
(c) firing said at least one silver-rich paste at a temperature and for a time sufficient to effect removal of said organic liquid vehicle and cause the silver and glass frit components of said at least one silver-rich paste to penetrate said silicon nitride layer and form a silver contact bonded to said first surface, without any penetration of said P-N junction by the components of said paste, said grid contact comprising a plurality of parallel fingers interconnected by at least one bus bar corresponding to said at least one portion of said grid pattern;
(d) applying a tin/silver solder paste to said at least one bus bar; and
(e) soldering a copper conductor to said at least one bus bar by successively heating and cooling said solder.

21. A method according to claim 20 wherein said solder comprises between about 96% tin/4% silver and about 98% tin/2% silver.

22. A method according to claim 21 wherein said silver particles have a particle size in the range of 0.5–10 microns.

23. A method according to claim 21 wherein said silver particles have a particle size of 1–2 microns.

24. A method of forming a solar cell having a low resistance electrical contact and an electrical conductor soldered thereto, with the bond between said contact and said solar cell having improved resistance to peel strength deterioration from thermal aging, said method comprising the steps of:
(a) providing a silicon substrate having first and second opposite surfaces, a P-N junction adjacent said first surface, and a silicon nitride layer covering said first surface;
(b) separately applying first and second silver-rich pastes to separate areas of the surface of said silicon nitride layer so as to define a grid contact pattern, with said first paste defining at least one bus bar pattern and said second paste defining a plurality of narrow finger patterns that intersect said at least one bus bar pattern, each of said first and second pastes comprising silver particles and a glass frit in an organic liquid vehicle, with substantially all of the silver particles of said first paste having a generally spherical shape;
(c) firing said pastes at a temperature of about 790 degrees C. for a time sufficient to effect removal of said organic liquid vehicle and cause the silver and glass frit components of said pastes to sinter and melt respectively and penetrate the silicon nitride layer and form an electrical contact bonded to said first surface of said substrate in the form of a plurality of fingers and at least one bus bar connecting said fingers, without any penetration of said P-N junction; and
(d) thereafter soldering a copper electrical conductor to said at least one bus bar using a tin/silver solder.

25. A method according to claim 24 wherein said solder comprises between about 96% tin/4% silver and about 98% tin/2% silver.

26. A method according to claim 25 wherein said silver particles have a particle size in the range of 0.5–10 microns.

27. A method according to claim 25 wherein said silver particles have a particle size of 1–2 microns.

28. A method according to claim 27 wherein said glass frit is a lead borosilicate glass.

* * * * *

UNITED STATES PATENT AND TRADEMARK OFFICE
CERTIFICATE OF CORRECTION

PATENT NO. : 5178685
DATED : January 12, 1993
INVENTOR(S) : Jeffrey T. Borenstein et al It is certified that error appears in the above-identified patent and that said Letters Patent is hereby corrected as shown below:

Claim 12, column 15, line 43, the word "apart" should be changed to read -- a part --.

Signed and Sealed this

Second Day of November, 1993

Attest:

BRUCE LEHMAN

Attesting Officer *Commissioner of Patents and Trademarks*